(12) United States Patent
Chiu et al.

(10) Patent No.: US 11,631,656 B2
(45) Date of Patent: Apr. 18, 2023

(54) METHOD FOR MANUFACTURING SEMICONDUCTOR STRUCTURE

(71) Applicant: NANYA TECHNOLOGY CORPORATION, New Taipei (TW)

(72) Inventors: Hsih-Yang Chiu, Taoyuan (TW); Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,177

(22) Filed: Dec. 7, 2021

(65) Prior Publication Data

US 2022/0102320 A1 Mar. 31, 2022

Related U.S. Application Data

(62) Division of application No. 16/601,575, filed on Oct. 14, 2019, now Pat. No. 11,342,307.

(51) Int. Cl.
*H01L 23/48* (2006.01)
*H01L 25/065* (2023.01)
(Continued)

(52) U.S. Cl.
CPC .... *H01L 25/0657* (2013.01); *H01L 21/76898* (2013.01); *H01L 24/03* (2013.01);
(Continued)

(58) Field of Classification Search
CPC ........... H01L 25/0657; H01L 21/76898; H01L 24/03; H01L 24/08; H01L 24/11; H01L 24/16; H01L 24/80; H01L 25/50; H01L 2224/08146; H01L 2224/16113; H01L 2224/80895; H01L 2224/80896; H01L 24/32; H01L 2224/29186; H01L 2224/32145; H01L 2224/83896; H01L 2225/06517; H01L 2225/06524; H01L 2225/06541; H01L 23/49811; H01L 21/4853; H01L 21/486; H01L 23/49827; H01L 23/49838; H01L 23/481; H01L 2924/00014; H01L 2924/00; H01L 2224/0401; H01L 24/05;
(Continued)

(56) References Cited

U.S. PATENT DOCUMENTS

| 6,518,670 | B1 * | 2/2003 | Mandelman | ........ H01L 23/5226 257/E21.507 |
| 10,840,190 | B1 * | 11/2020 | Yang | ................ H01L 21/76805 |

(Continued)

FOREIGN PATENT DOCUMENTS

| TW | 200701853 A | 1/2007 |
| TW | 201830620 A | 8/2018 |

*Primary Examiner* — Samuel Park
(74) *Attorney, Agent, or Firm* — CKC & Partners Co., LLC

(57) ABSTRACT

A semiconductor structure includes a first die, a second die, and a first conductive via. The first die includes a first dielectric layer and a first landing pad embedded in the first dielectric layer. The second die includes a second dielectric layer and a second landing pad embedded in the second dielectric layer. The first die is disposed on the second die. The second landing pad has a through-hole. The first conductive via extends from the first landing pad toward the second landing pad and penetrates through the through-hole of the second landing pad.

9 Claims, 14 Drawing Sheets

(51) Int. Cl.
*H01L 23/00* (2006.01)
*H01L 25/00* (2006.01)
*H01L 21/768* (2006.01)

(52) U.S. Cl.
CPC .............. *H01L 24/08* (2013.01); *H01L 24/11* (2013.01); *H01L 24/16* (2013.01); *H01L 24/80* (2013.01); *H01L 25/50* (2013.01); *H01L 2224/08146* (2013.01); *H01L 2224/16113* (2013.01); *H01L 2224/80895* (2013.01); *H01L 2224/80896* (2013.01)

(58) Field of Classification Search
CPC . H01L 2924/15311; H01L 2225/06513; H01L 2924/014; H01L 24/13; H01L 2224/16225; H01L 2924/00012; H01L 2224/05647; H01L 2224/16145
See application file for complete search history.

(56) References Cited

U.S. PATENT DOCUMENTS

| | | |
|---|---|---|
| 2007/0246816 A1 | 10/2007 | Tajika et al. |
| 2009/0008790 A1 | 1/2009 | Lee et al. |
| 2012/0059984 A1 | 3/2012 | Kang et al. |
| 2013/0336039 A1 | 12/2013 | Frans |
| 2014/0252612 A1 | 9/2014 | Nakagawa |
| 2015/0091187 A1 | 4/2015 | Reber et al. |
| 2016/0020170 A1* | 1/2016 | Ho ......................... H01L 24/02 257/774 |
| 2018/0025970 A1 | 1/2018 | Kao et al. |
| 2020/0020733 A1* | 1/2020 | Fujii ...................... H01L 24/08 |

* cited by examiner

METHOD FOR MANUFACTURING SEMICONDUCTOR STRUCTURE

CROSS-REFERENCE TO RELATED APPLICATION

The present application is a Divisional Application of the U.S. application Ser. No. 16/601,575, filed Oct. 14, 2019, the entirety of which is incorporated by reference herein in their entireties.

BACKGROUND

Field of Invention

The present disclosure relates to a method for manufacturing a semiconductor structure. More particularly, the present disclosure relates to a method for manufacturing a semiconductor structure including a conductive via penetrating a through-hole of a landing pad.

Description of Related Art

One of the major trends in the semiconductor industry is to minimize the size of a semiconductor device. The demand for miniaturization is particularly high in the semiconductor device package, such as multichip package. For example, a multichip package includes integrated chips and fine-pattern printed circuits sealed with plastic resin or ceramic material. Minimizing the size of integrated chips contained in the package was one of the primary objectives of package technicians.

SUMMARY

The present disclosure provides a semiconductor structure including a first die, a second die, and a first conductive via. The first die includes a first dielectric layer and a first landing pad embedded in the first dielectric layer. The second die includes a second dielectric layer and a second landing pad embedded in the second dielectric layer. The first die is disposed on the second die. The second landing pad has a through-hole. The first conductive via extends from the first landing pad toward the second landing pad and penetrates through the through-hole of the second landing pad.

In some embodiments, the first conductive via is separated from the second landing pad with the second dielectric layer.

In some embodiments, the first die is a slave die.

In some embodiments, the second die is a slave die.

In some embodiments, the semiconductor structure further includes a third die disposed under the second die, wherein the third die includes a first bump on a lower surface of the third die, and the first conductive via extends through the third die to connect with the first bump.

In some embodiments, the third die is a master die.

In some embodiments, the semiconductor structure further includes a second conductive via extending from the second landing pad into the third die, wherein the third die further includes a second bump on the lower surface of the third die, and the second conductive via is connected with the second bump.

In some embodiments, the third die includes a third dielectric layer and a first bonding layer, and the first bonding layer is disposed between the third dielectric layer and the second die.

In some embodiments, the second die further includes a second bonding layer disposed between the second dielectric layer and the first bonding layer.

In some embodiments, the first die further includes a first bonding layer disposed between the first dielectric layer and the second die.

In some embodiments, the second die further includes a second bonding layer disposed between the second dielectric layer and the first die.

The present disclosure provides a method for manufacturing a semiconductor structure. The method includes the following steps. A first die is bonded with a second die, wherein the first die is disposed on the second die. The first die includes a first dielectric layer and a first landing pad embedded in the first dielectric layer. The second die includes a second dielectric layer and a second landing pad embedded in the second dielectric layer. The second landing pad has a through-hole, and a portion of the second dielectric layer is filled in the through-hole of the second landing pad. A first hole is formed through the first die and the portion of the second dielectric layer of the second die to expose the first landing pad. A first conductive via is formed in the first hole.

In some embodiments, before forming the first hole, the method further includes bonding a third die with the second die, wherein the third die is disposed under the second die, wherein forming the first hole includes forming the first hole through the third die.

In some embodiments, the method further includes the following steps. A second hole is formed through the second die and the third die to expose the second landing pad. A second conductive via is formed in the second hole.

In some embodiments, the third die is bonded with the second die by a direct bonding process.

In some embodiments, the method further includes forming a first bump on a lower surface of the third die, wherein the first bump is connected with the first conductive via.

In some embodiments, before bonding the first die with the second die, the method further includes forming the second die. Forming the second die includes the following steps. A conductive layer is formed on a third dielectric layer. The conductive layer is patterned to form the second landing pad having the through-hole. A fourth dielectric layer is formed to cover the second landing pad and the third dielectric layer.

In some embodiments, forming the fourth dielectric layer includes the following steps. A fifth dielectric layer is formed to cover the second landing pad and the third dielectric layer. A portion of the fifth dielectric layer is removed to expose an upper surface of the second landing pad. A sixth dielectric layer is formed to cover the second landing pad and the fifth dielectric layer.

In some embodiments, the first die is bonded with the second die by a direct bonding process.

In some embodiments, the first die includes a first bonding layer, the second die includes a second bonding layer, and bonding the first die with the second die includes bonding the first bonding layer of the first die and the second bonding layer of the second die.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
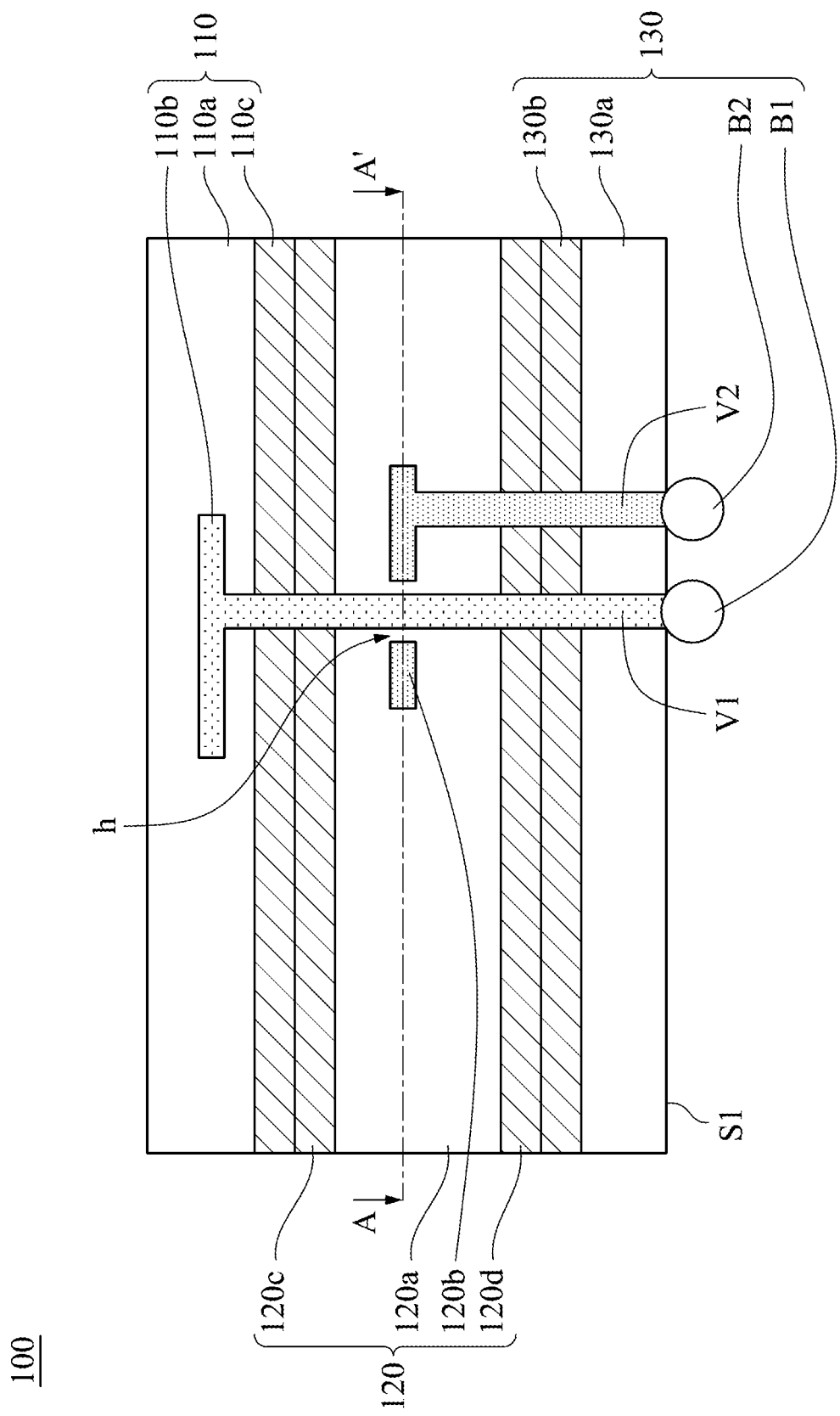
FIG. 1A is a cross-sectional view schematically illustrating a semiconductor structure in accordance with some embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The present disclosure provides a semiconductor structure. FIG. 1A is a cross-sectional view schematically illustrating a semiconductor structure 100 in accordance with some embodiments of the present disclosure. The semiconductor structure 100 includes a first die 110, a second die 120, a third die 130, a first conductive via V1, a second conductive via V2, a first bump B1, and a second bump B2. The first die 110 is disposed on the second die 120. The third die 130 is disposed under the second die 120. The first die 110 includes a first dielectric layer 110a and a first landing pad 110b embedded in the first dielectric layer 110a. The second die 120 includes a second dielectric layer 120a and a second landing pad 120b embedded in the second dielectric layer 120a. The third die 130 includes a third dielectric layer 130a. The first bump B1 and the second bump B2 are disposed on a lower surface S1 of the third die 130. The first conductive via V1 extends from the first landing pad 110b toward the second landing pad 120b and penetrates through the through-hole h of the second landing pad 120b. For example, the through-hole h may have a diameter less than 20 µm. Moreover, the first conductive via V1 extends through the third die 130 to connect with the first bump B1. Further, the second conductive via V2 extends from the second landing pad 120b into the third die 130 to connect with the second bump B2 on the lower surface S1 of the third die 130.

In some embodiments, the first conductive via V1, the second conductive via V2, the first landing pad 110b, and the second landing pad 120b respectively include copper, gold, tungsten, or alloys thereof. In some embodiments, the first dielectric layer 110a, the second dielectric layer 120a, and the third dielectric layer 130a respectively includes silicon dioxide ($SiO_2$), silicon nitride (SiN), silicon oxide-silicon oxynitride-silicon oxide (ONO), or a combination thereof.

In some embodiments, the first die 110 is a slave die. In some embodiments, the second die 120 is a slave die. In some embodiments, the third die 130 is a master die. Signals can be transmitted from the third die 130 to the first die 110 through the first conductive via V1 and from the third die 130 to the second die 120 through the second conductive via V2.

In some embodiments, the first die 110 is directly bonded with the second die 120. In some embodiments, the first die 110 is bonded with the second die 120 by an oxide fusion bonding. In some embodiments, the first die 110 includes a bonding layer 110c disposed between the first dielectric layer 110a and the second die 120 as show in FIG. 1A. The first die 110 is bonded to the second die 120 with the bonding layer 110c. In some embodiments, the second die 120 includes a bonding layer 120c disposed between the second dielectric layer 120a and the first die 110 as show in FIG. 1A. The first die 110 is bonded to the second die 120 with the bonding layer 120c. In some embodiments, the bonding layer 110c and the bonding layer 120c are oxide layers. In some other embodiments, the first dielectric layer 110a is in direct contact with the second dielectric layer 120a.

In some embodiments, the second die 120 is directly bonded with the third die 130. In some embodiments, the second die 120 is bonded with the third die 130 by an oxide fusion bonding. In some embodiments, the third die 130 includes a bonding layer 130b disposed between the third dielectric layer 130a and the second die 120 as show in FIG. 1A. The second die 120 is bonded to the third die 130 with the bonding layer 130b. In some embodiments, the second die 120 includes a bonding layer 120d disposed between the second dielectric layer 120a and the bonding layer 130b as show in FIG. 1A. The second die 120 is bonded to the third die 130 with the bonding layer 120d. In some embodiments, the bonding layer 120d and the bonding layer 130b are oxide layers. In some other embodiments, the second dielectric layer 120a is in direct contact with the third dielectric layer 130a.

Figure 1B:
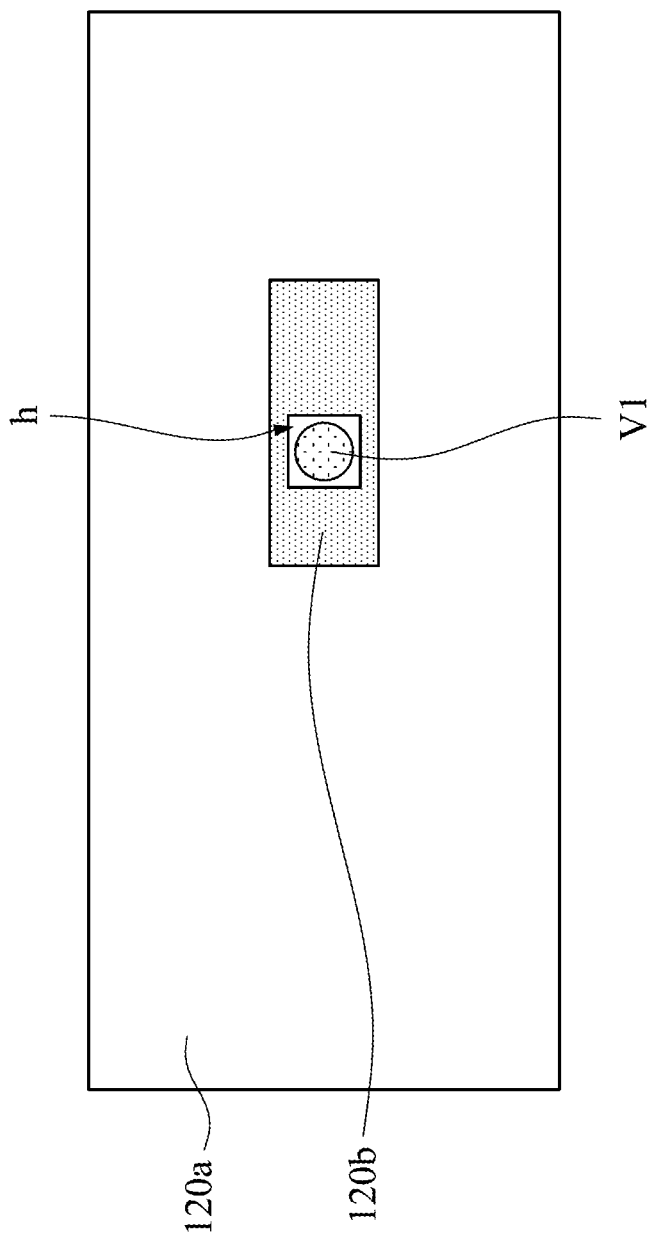
FIG. 1B is a cross-sectional view schematically illustrating the semiconductor structure in FIG. 1A along a line A-A' in accordance with some embodiments of the present disclosure.

FIG. 1B is a cross-sectional view schematically illustrating the semiconductor structure 100 in FIG. 1A along a line A-A' in accordance with some embodiments of the present disclosure. Please refer to FIGS. 1A and 1B simultaneously. The second landing pad 120b in the second dielectric layer 120a has the through-hole h. The first conductive via V1 extends from the first landing pad 110b toward the second landing pad 120b and penetrates through the through-hole h of the second landing pad 120b. The first conductive via V1 is separated and isolated from the second landing pad 120b with the second dielectric layer 120a. More specifically, a portion of the second dielectric layer 120a surrounds the first conductive via V1, and the second landing pad 120b surrounds the portion of the second dielectric layer 120a.

Figure 2:
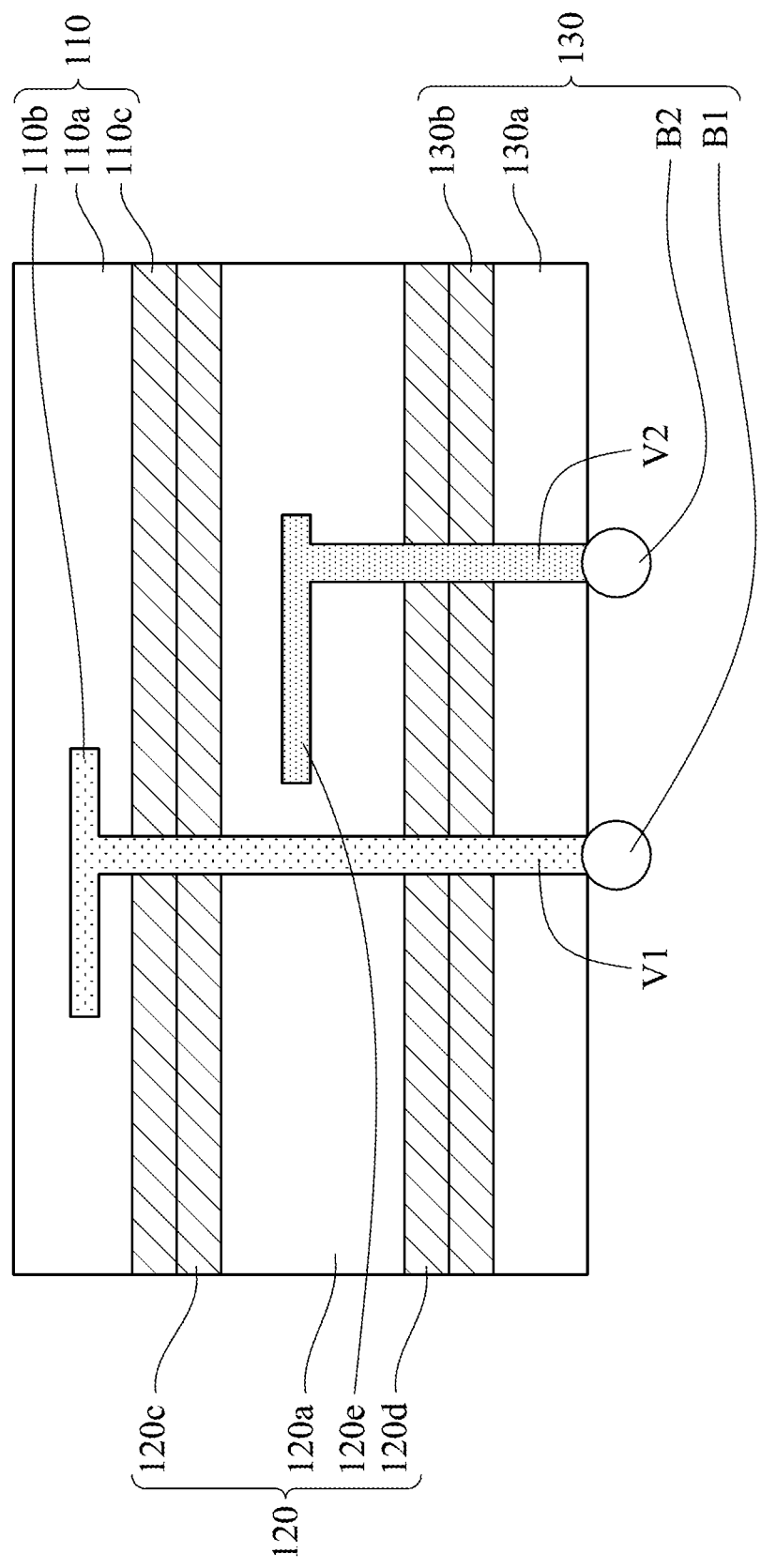
FIG. 2 is a cross-sectional view schematically illustrating a semiconductor structure of a comparative example of the present disclosure.

FIG. 2 is a cross-sectional view schematically illustrating a semiconductor structure 200 of a comparative example of the present disclosure. Please refer to FIGS. 1A and 2 simultaneously. In FIG. 1A, the first conductive via V1 penetrates through the through-hole h of the second landing pad 120b. However, in FIG. 2, the second landing pad 120e does not have any through-hole, and therefore the first conductive via V1 must be disposed beside the second landing pad 120b. Generally, a landing pad would occupy a large space. For example, the width of the landing pad may larger than 50 µm. Compared to the semiconductor structure 100, the semiconductor structure 200 need more space for disposing of the first conductive via V1, the second conductive via V2, the first landing pad 110b, and the second landing pad 120b. Accordingly, the semiconductor structure 100 of the present disclosure can effectively utilize space and is beneficial for reducing the size of the semiconductor structure 100.

The present disclosure provides a method for manufacturing a semiconductor structure. FIGS. 3-6 are cross-sectional views of a method for manufacturing a semiconductor structure at various stages in accordance with some embodiments of the present disclosure.

Figure 3:
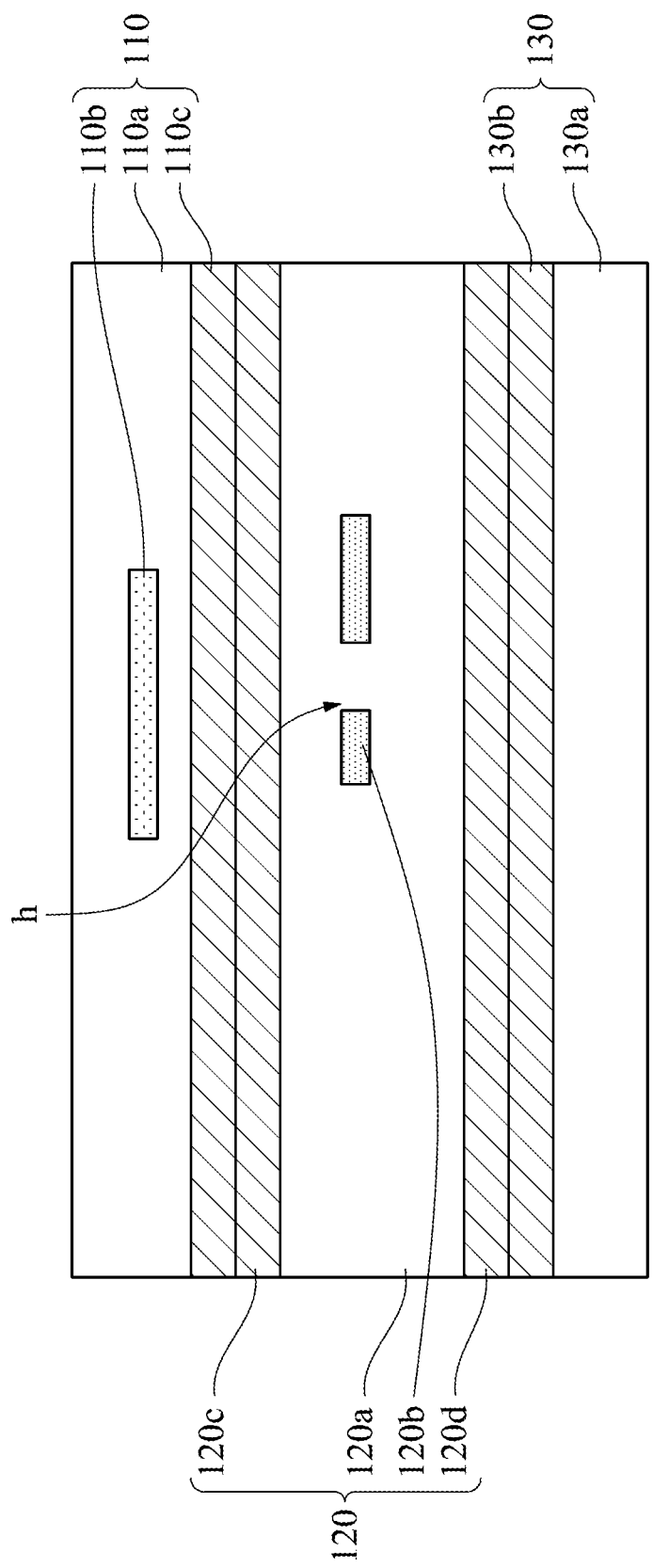
FIGS. 3-6 are cross-sectional views of a method for manufacturing a semiconductor structure at various stages in accordance with some embodiments of the present disclosure.

As shown in FIG. 3, a first die 110 is bonded with a second die 120, and the second die 120 is bonded with a third die 130. The first die 110 is disposed on the second die 120. The third die 130 is disposed under the second die 120. The first die 110 includes a first dielectric layer 110a and a first landing pad 110b embedded in the first dielectric layer 110a. The second die 120 includes a second dielectric layer 120a and a second landing pad 120b embedded in the second dielectric layer 120a. The second landing pad 120b has a through-hole h, and a portion of the second dielectric layer 120a is filled in the through-hole h of the second landing pad 120b.

In some embodiments, the first die 110 is bonded with the second die 120 by a direct bonding process. In some embodiments, the first die 110 is bonded with the second die 120 by an oxide fusion bonding. In some embodiments, the first die 110 includes a bonding layer 110c, and the second die 120 includes a bonding layer 120c. The first die 110 is bonded with the second die 120 by bonding the bonding layer 110c of the first die 110 and the bonding layer 120c of the second die 120. In some other embodiments, the first die 110 is bonded with the second die 120 by directly bonding the first dielectric layer 110a and the second dielectric layer 120a.

In some embodiments, the second die 120 is bonded with the third die 130 by a direct bonding process. In some embodiments, the second die 120 is bonded with the third die 130 by an oxide fusion bonding. In some embodiments, the second die 120 includes a bonding layer 120d, and the third die 130 includes a bonding layer 130b. The second die 120 is bonded with the third die 130 by bonding the bonding layer 120d of the second die 120 and the bonding layer 130b of the third die 130. In some other embodiments, the second die 120 is bonded with the third die 130 by directly bonding the second dielectric layer 120a and the third dielectric layer 130a.

Figure 4:
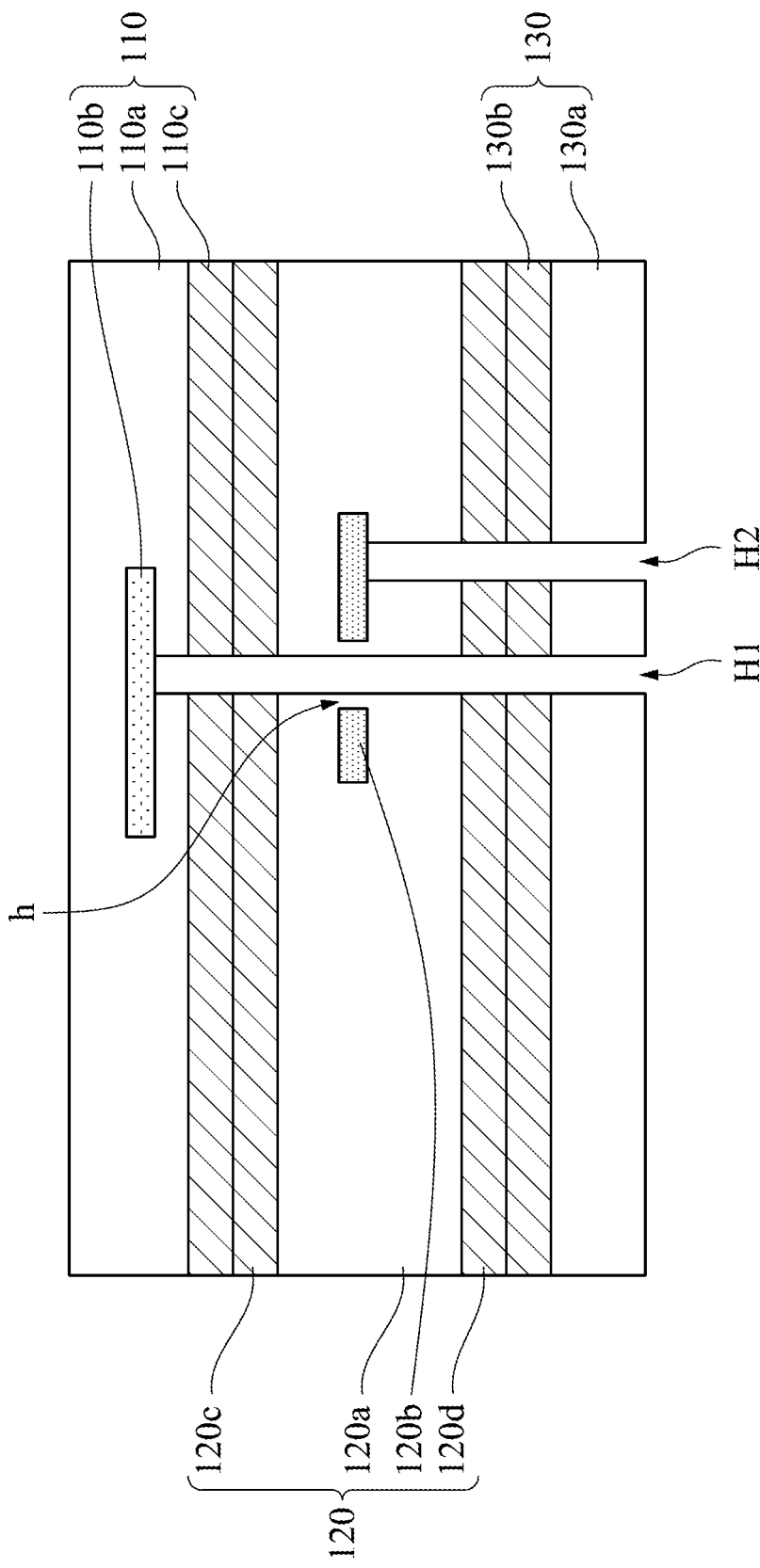

As shown in FIG. 4, a first hole H1 is formed through the first die 110, the second die 120, and the third die 130 to expose the first landing pad 110b, and a second hole H2 is formed through the second die 120 and the third die 130 to expose the second landing pad 120b. More specifically, the first hole H1 is formed through a portion of the second dielectric layer 120a which is filled in the through-hole h of the second landing pad 120b.

Figure 5:
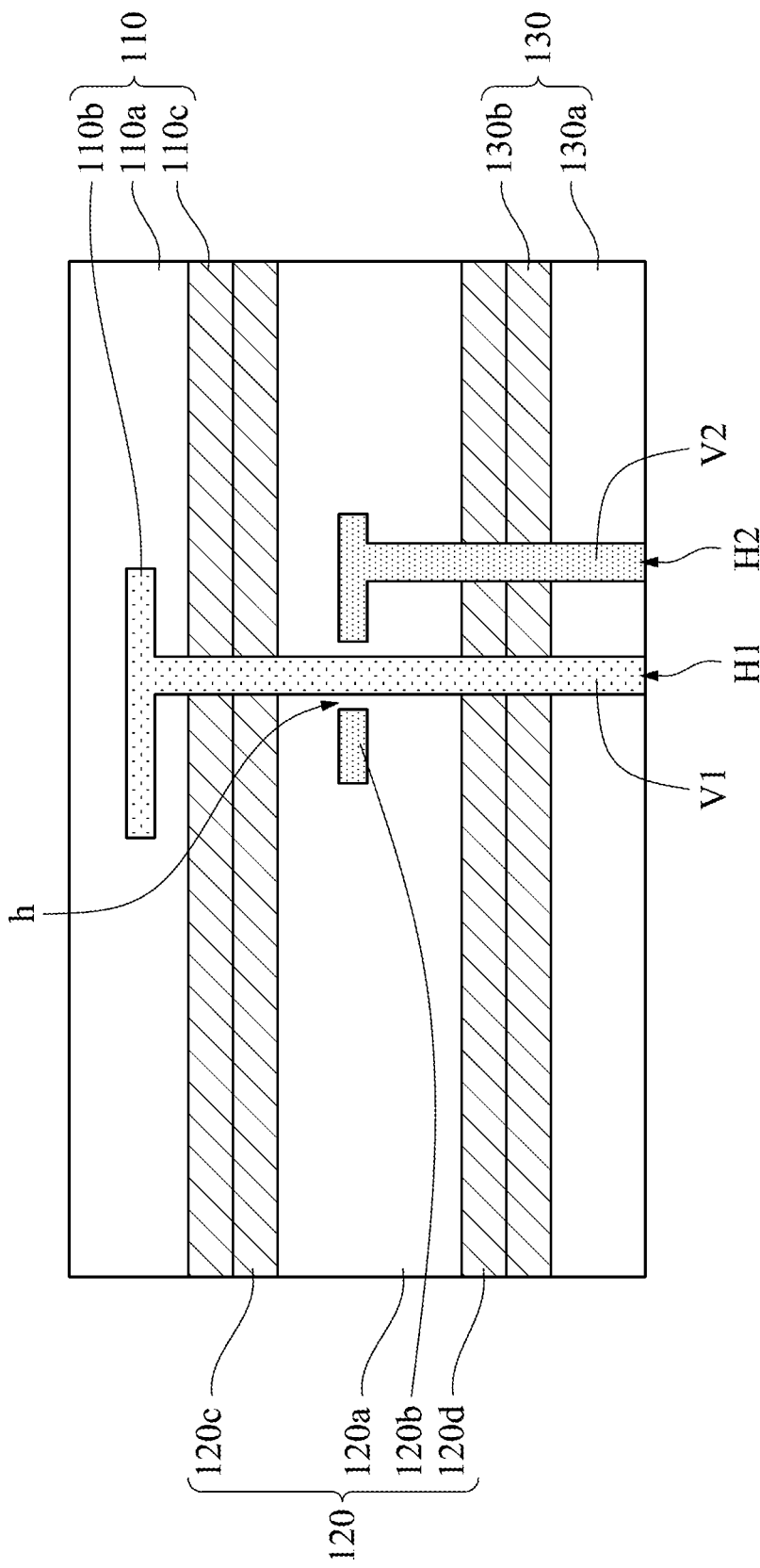

As shown in FIG. 5, a first conductive via V1 is formed in the first hole H1, and a second conductive via V2 is formed in the second hole H2.

Figure 6:
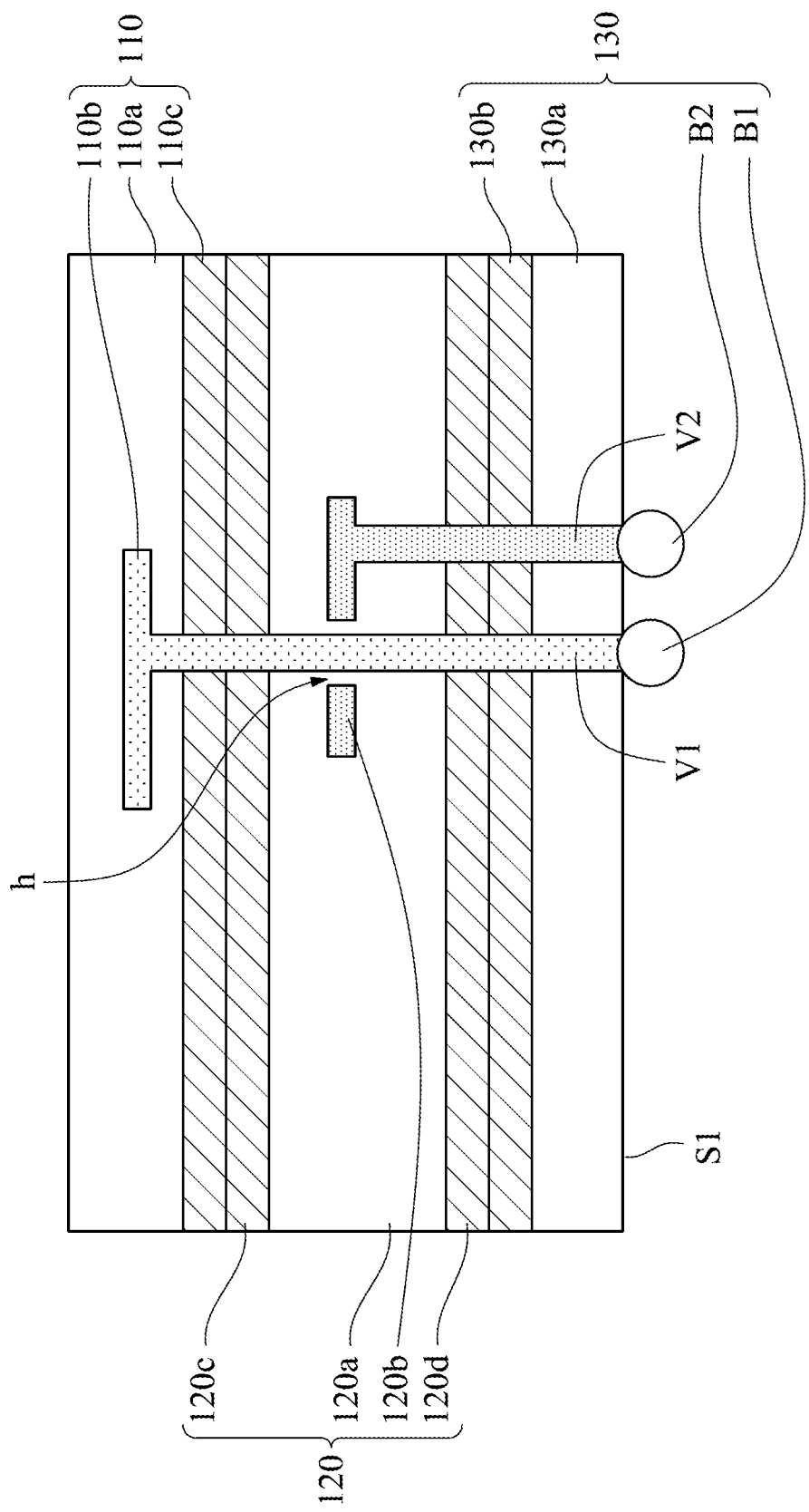

As shown in FIG. 6, a first bump B1 is formed on the lower surface S1 of the third die 130 to connect with the first conductive via V1, and a second bump B2 is formed on the lower surface S1 of the third die 130 to connect with the second conductive via V2 to form a semiconductor structure 100. The semiconductor structure 100 of the present disclosure can effectively utilize space and is beneficial for reducing the size of the semiconductor structure 100.

The present disclosure provides a method for manufacturing a die. In some embodiments, the second die 120 shown in FIG. 3 is manufactured by the steps shown in FIGS. 7-13. FIGS. 7-13 are cross-sectional views of a method for manufacturing a die at various stages in accordance with some embodiments of the present disclosure.

Figure 7:
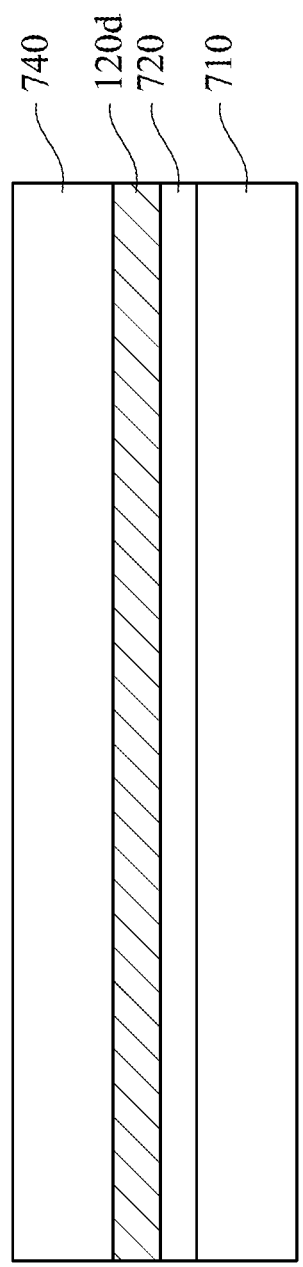
FIGS. 7-13 are cross-sectional views of a method for manufacturing a die at various stages in accordance with some embodiments of the present disclosure.
Figure 8:
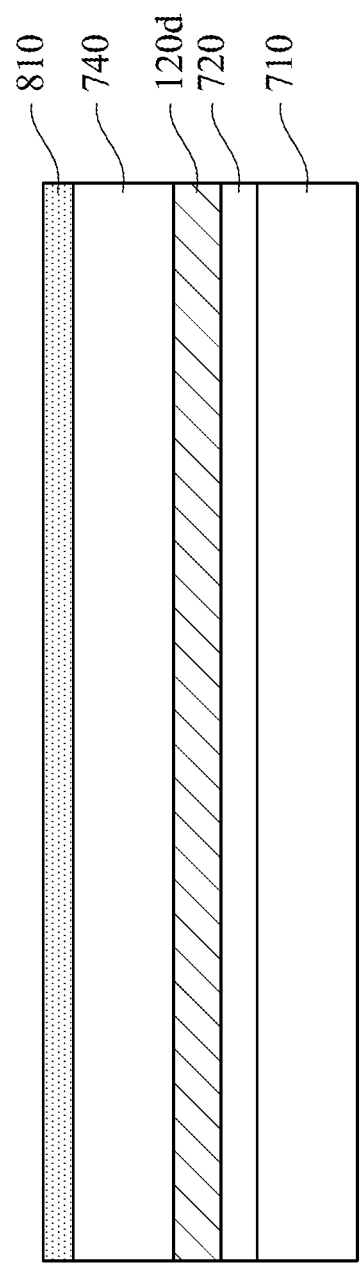
Figure 9:
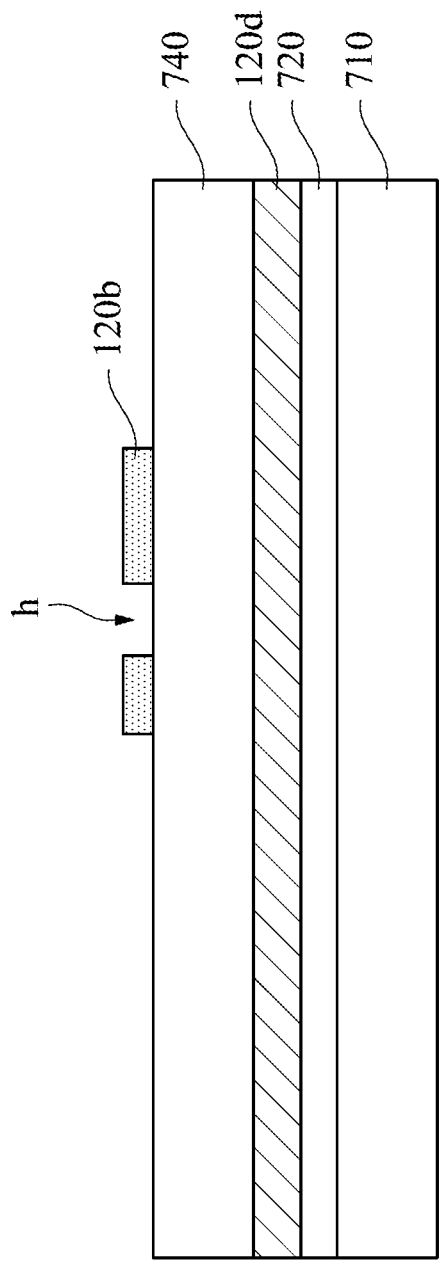

As shown in FIG. 7, a carrier 710, a release film 720, a bonding layer 120d and a dielectric layer 740 are received. In some embodiments, the bonding layer 120d is an oxide layer. As shown in FIG. 8, a conductive layer 810 is formed on the dielectric layer 740. As shown in FIG. 9, the conductive layer 810 is patterned to form a landing pad 120b having a through-hole h, and expose the upper surface of the dielectric layer 740.

Figure 10:
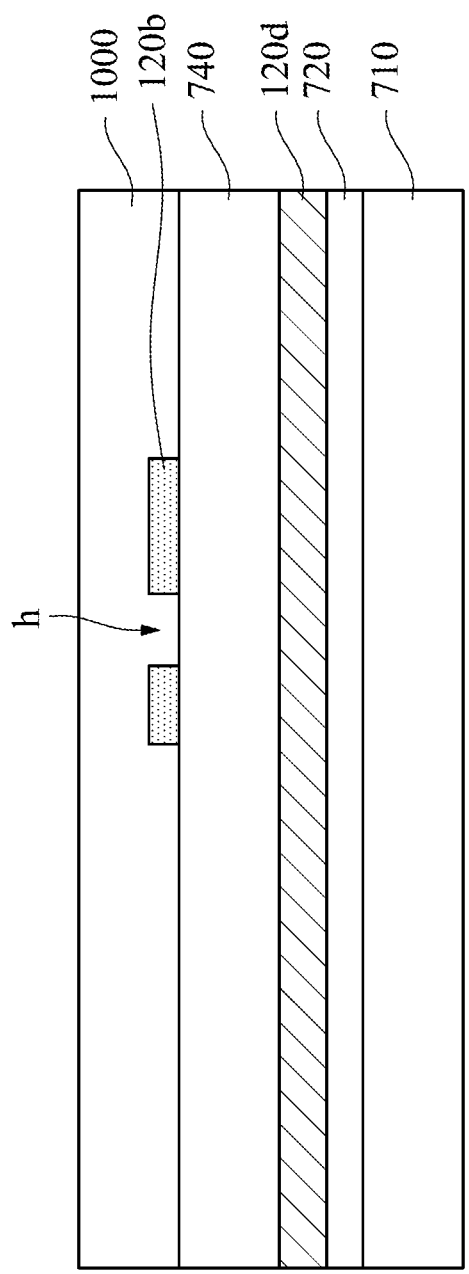
Figure 11:
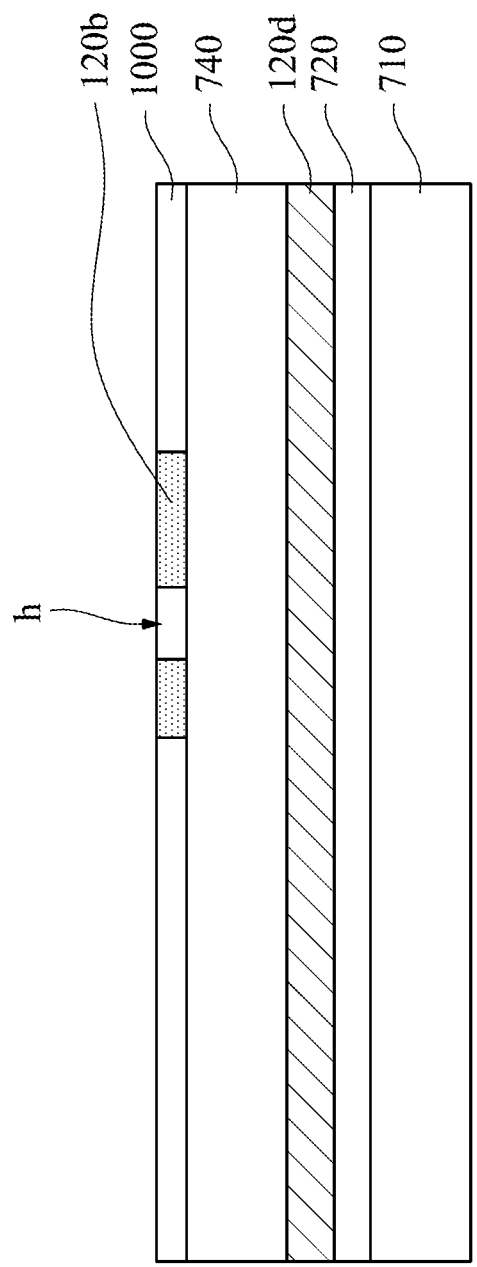
Figure 12:
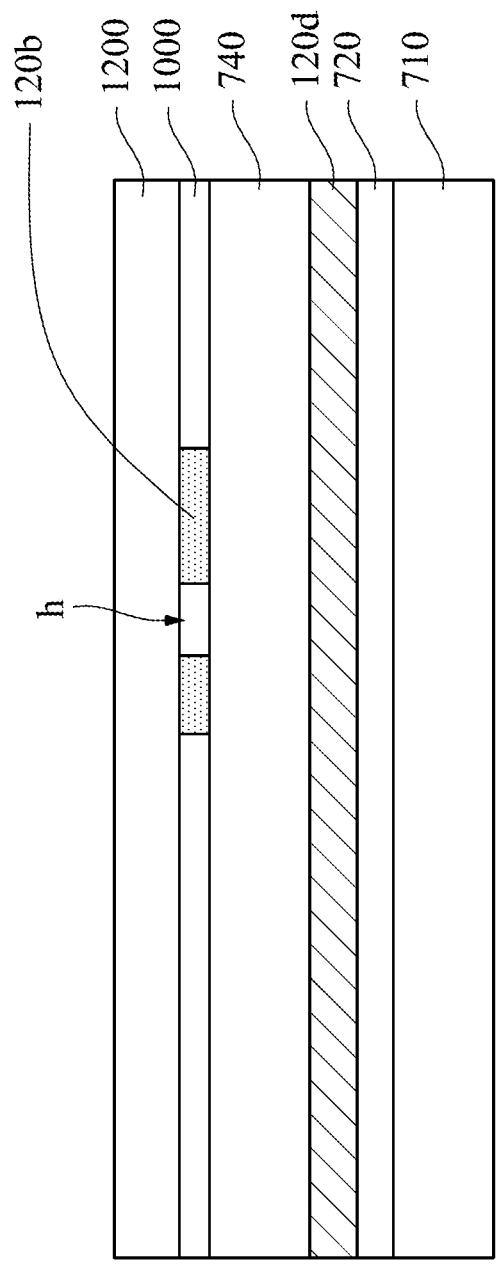

Next, a dielectric layer is formed to cover the landing pad and the dielectric layer 740 and fill the through-hole h as shown in FIG. 12. In some embodiment, the dielectric layer is formed by the steps described in FIGS. 10-12. As shown in FIG. 10, a dielectric layer 1000 is formed to cover the landing pad 120b and the dielectric layer 740. The dielectric layer 1000 has a thickness greater than that of the landing pad 120b. In some embodiments, the upper surface of the dielectric layer 1000 is uneven. Subsequently, as shown in FIG. 11, a portion of the dielectric layer 1000 is removed to expose an upper surface of the second landing pad 120b. In some embodiments, the portion of the dielectric layer 1000 is removed by a chemical-mechanical polishing (CMP) process. Next, as shown in FIG. 12, a dielectric layer 1200 is formed to cover the landing pad 120b and the dielectric layer 1000.

Figure 13:
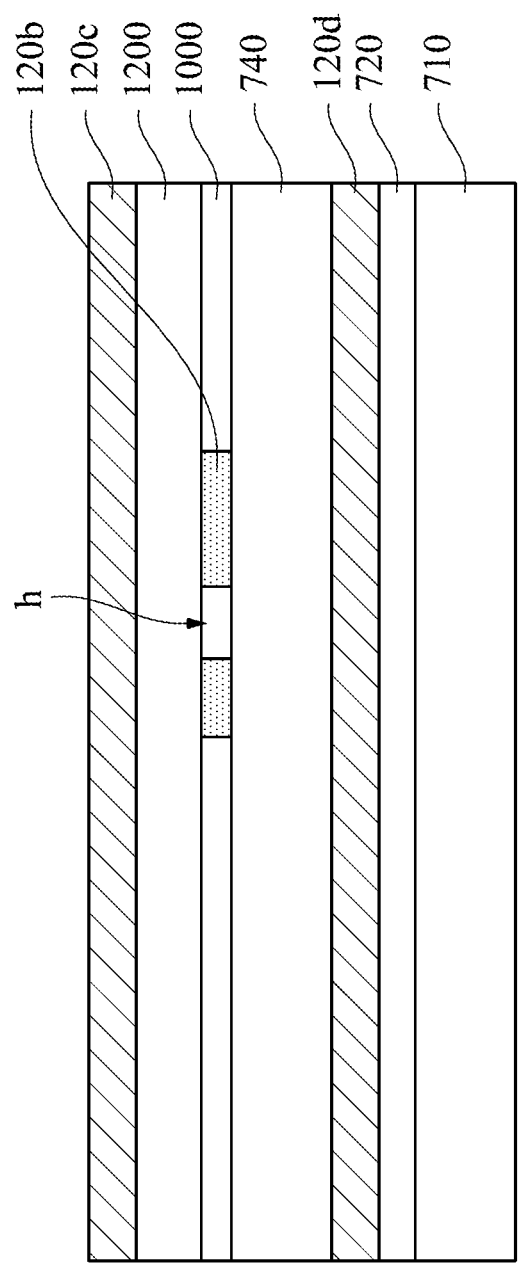

As shown in FIG. 13, a bonding layer 120c is formed on the dielectric layer 1200. Therefore, a die similar to the die 120 shown in FIG. 3 is formed on the carrier 710 and the release film 720. In some embodiments, the bonding layer 120c is an oxide layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor structure, the method comprising:
   bonding a first die with a second die,
      wherein the first die is disposed on the second die, the first die comprises a first dielectric layer and a first landing pad embedded in the first dielectric layer, the second die comprises a second dielectric layer and a second landing pad embedded in the second dielectric layer, the second landing pad has a through-hole, and a portion of the second dielectric layer is filled in the through-hole of the second landing pad;
   forming a first hole through the first die and the portion of the second dielectric layer of the second die to expose the first landing pad; and
   forming a first conductive via in the first hole, wherein the first conductive via is separated from the second landing pad with the second dielectric layer.

2. The method of claim 1, before forming the first hole, further comprising bonding a third die with the second die, wherein the third die is disposed under the second die, wherein forming the first hole comprises forming the first hole through the third die.

3. The method of claim 2, further comprising:
forming a second hole through the second die and the third die to expose the second landing pad; and
forming a second conductive via in the second hole.

4. The method of claim 2, wherein the third die is bonded with the second die by a direct bonding process.

5. The method of claim 2, further comprising forming a first bump on a lower surface of the third die, wherein the first bump is connected with the first conductive via.

6. The method of claim 1, before bonding the first die with the second die, further comprising forming the second die, wherein forming the second die comprises:
forming a conductive layer on a third dielectric layer;
patterning the conductive layer to form the second landing pad having the through-hole; and
forming a fourth dielectric layer to cover the second landing pad and the third dielectric layer, wherein the second dielectric layer comprises the third dielectric layer and the fourth dielectric layer.

7. The method of claim 6, wherein forming the fourth dielectric layer comprises:
forming a fifth dielectric layer to cover the second landing pad and the third dielectric layer;
removing a portion of the fifth dielectric layer to expose an upper surface of the second landing pad; and
forming a sixth dielectric layer to cover the second landing pad and the fifth dielectric layer, wherein the fourth dielectric layer comprises the fifth dielectric layer and the sixth dielectric layer.

8. The method of claim 1, wherein the first die is bonded with the second die by a direct bonding process.

9. The method of claim 1, wherein the first die comprises a first bonding layer, the second die comprises a second bonding layer, and bonding the first die with the second die comprises bonding the first bonding layer of the first die and the second bonding layer of the second die.

* * * * *